(12) United States Patent
Nakatani

(10) Patent No.: US 11,746,416 B2
(45) Date of Patent: Sep. 5, 2023

(54) METHOD OF PROCESSING SUBSTRATE AND MANUFACTURING SEMICONDUCTOR DEVICE BY FORMING FILM CONTAINING SILICON

(71) Applicant: KOKUSAI ELECTRIC CORPORATION, Tokyo (JP)

(72) Inventor: Kimihiko Nakatani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 1085 days.

(21) Appl. No.: 16/224,256

(22) Filed: Dec. 18, 2018

(65) Prior Publication Data

US 2019/0189432 A1    Jun. 20, 2019

(30) Foreign Application Priority Data

Dec. 20, 2017  (JP) ................................ 2017-243929

(51) Int. Cl.
| | |
|---|---|
| *C23C 16/36* | (2006.01) |
| *C23C 16/455* | (2006.01) |
| *C23C 16/56* | (2006.01) |
| *H01L 21/02* | (2006.01) |

(52) U.S. Cl.
CPC ........ *C23C 16/45531* (2013.01); *C23C 16/36* (2013.01); *C23C 16/56* (2013.01); *H01L 21/02126* (2013.01); *H01L 21/02219* (2013.01); *C23C 16/45534* (2013.01)

(58) Field of Classification Search
CPC .... C23C 16/36; C23C 16/56; C23C 16/45531
See application file for complete search history.

(56) References Cited

U.S. PATENT DOCUMENTS

| | | | | |
|---|---|---|---|---|
| 9,401,273 | B2 * | 7/2016 | Pore | H01L 21/02167 |
| 9,837,263 | B2 * | 12/2017 | Pore | C23C 16/30 |
| 10,199,211 | B2 * | 2/2019 | Pore | H01L 21/02167 |
| 10,515,794 | B2 * | 12/2019 | Pore | H01L 21/02211 |
| 2007/0082492 | A1 * | 4/2007 | Kim | H01L 21/318 |
| | | | | 438/700 |
| 2013/0217239 | A1 | 8/2013 | Mallick et al. | |
| 2013/0217240 | A1 | 8/2013 | Mallick et al. | |
| 2013/0217241 | A1 | 8/2013 | Underwood et al. | |
| 2013/0217243 | A1 | 8/2013 | Underwood et al. | |
| 2014/0023794 | A1 * | 1/2014 | Mahajani | C23C 16/45534 |
| | | | | 427/535 |
| 2014/0179085 | A1 | 6/2014 | Hirose et al. | |
| 2014/0227886 | A1 | 8/2014 | Sano et al. | |
| 2014/0272194 | A1 * | 9/2014 | Xiao | C23C 16/24 |
| | | | | 427/255.394 |
| 2014/0273526 | A1 * | 9/2014 | Thompson | C23C 16/36 |
| | | | | 438/786 |
| 2014/0287596 | A1 | 9/2014 | Hirose et al. | |
| 2015/0162185 | A1 * | 6/2015 | Pore | C23C 16/45553 |
| | | | | 438/786 |
| 2016/0020091 | A1 * | 1/2016 | Saly | H01L 21/02274 |
| | | | | 438/767 |
| 2016/0233085 | A1 | 8/2016 | Yamaguchi et al. | |
| 2017/0092503 | A1 | 3/2017 | Degai | |
| 2018/0082838 | A1 * | 3/2018 | Pore | H01L 21/02167 |
| 2018/0363138 | A1 | 12/2018 | Nakatani et al. | |
| 2019/0055645 | A1 | 2/2019 | Li et al. | |

FOREIGN PATENT DOCUMENTS

| | | | | | |
|---|---|---|---|---|---|
| CN | 106653847 | A | * | 5/2017 | H01L 29/78 |
| CN | 106653847 | A | * | 5/2017 | H01L 29/78 |
| EP | 1967609 | B1 | * | 7/2015 | C23C 16/30 |
| JP | 2010-147485 | | * | 7/2010 | H01L 21/318 |
| JP | 2014-127524 | A | | 7/2014 | |
| JP | 2014-154809 | A | | 8/2014 | |
| JP | 2017-066451 | A | | 4/2017 | |
| KR | 10-2008-0061486 | A | | 7/2008 | |
| KR | 20140114761 | A | | 9/2014 | |
| TW | 201316407 | A | | 4/2013 | |
| TW | 201513219 | A | | 4/2015 | |
| WO | 2015/045099 | A1 | | 4/2015 | |
| WO | WO 2016/205196 | A2 | * | 12/2016 | C23C 16/455 |
| WO | 2017/147150 | A1 | | 8/2017 | |
| WO | 2017/149604 | A1 | | 9/2017 | |

OTHER PUBLICATIONS

Bessling, W.F.A., et al., "Laser-induced chemical vapor deposition of nanostructured silicon carbonitride thin films". Journal of Applied Physics 83, 544-553 (1998).*
Fainer, N.I., et al., "Synthesis of Silicon Carbonitride Dielectric Films with Improved Optical and Mechanical Properties from Tetramethyldisilazane". Glass Physics and Chemistry, 2013, vol. 39, No. 1, pp. 77-82.*
Hossbach, C., et al., "Properties of Plasma-Enhanced Atomic Layer Deposition-Grown Tantalum Carbonitride Thin Films". Journal of the Electrochemical Society, 156 (11) H852-H859 (2009).*
Wrobel, Aleksander M., et al., "Hard silicon carbonitride thin-film coatings produced by remote hydrogen plasma chemical vapor deposition using aminosilane and silazane precursors. 1: Deposition mechanism, chemical structure, and surface morphology". Plasma Processes and Polymers, 2021; 18, pp. 1-19.*
Zhou, Yanping, et al., "Hard silicon carbonitride films obtained by RF-plasma-enhanced chemical vapour deposition using the single-source precursor bis(trimethylsilyl)carbodiimide". Journal of the European Ceramic Society 26 (2006) 1325-1335.*
Besling, W.F.A., et al., "Laser-induced chemical vapor deposition of nanostructured silicon carbonitride thin films". Journal of Applied Physics 83 (1) (1998) pp. 544-553.*
Wrobel, A.M., et al., "Silicon Carbonitride Films by Remote Hydrogen-Nitrogen Plasma CVD from a Tetramethyldisilazane Source". Journal of the Electrochemical Society, 151 (11) C723-C730 (2004).*

(Continued)

*Primary Examiner* — Bret P Chen
(74) *Attorney, Agent, or Firm* — Volpe Koenig

(57) ABSTRACT

There is a provided a technique that includes forming a film containing Si, C and N on a substrate by performing a cycle a predetermined number of times, the cycle including non-simultaneously performing: (a) supplying a first precursor containing a Si—C bond and not containing halogen to the substrate; and (b) supplying a second precursor containing a Si—N bond and not containing an alkyl group to the substrate, wherein (a) and (b) are performed under a condition that at least a part of the Si—C bond in the first precursor and at least a part of the Si—N bond in the second gas are held without being cut.

19 Claims, 11 Drawing Sheets

(56) References Cited

OTHER PUBLICATIONS

Sha, Bo, et al., "Carbon-rich amorphous silicon carbide and silicon carbonitride films for silicon-based photoelectric devices and optical elements: Application from UV to mid-IR spectral range". Optical Materials, 106 (2020) 109959, pp. 1-10.*

Ovanesyan, Rafaiel, et al., "Atomic Layer Deposition of SiCxNy Using Si2Cl6 and CH3NH2 Plasma". Chem. Mater. 2017, 29, 15, 6269-6278.*

Fainer, Nadezhda, et al., "Low-k dielectrics on base of silicon carbon nitride films". Surface & Coatings Technology 201 (2007) 9269-9274.*

Japanese Office Action dated Jun. 23, 2020 for the Japanese Patent Application No. 2017-243929.

Taiwanese Office Action dated Mar. 12, 2020 for the Taiwanese Patent Application No. 107144813.

Korean Office Action dated Feb. 26, 2020 for the Korean Patent Application No. 10-2018-0163017.

Korean Office Action dated Sep. 1, 2020 for Korean Patent Application No. 10-2018-0163017.

Taiwanese Office Action dated Nov. 9, 2020 for Taiwanese Patent Application No. 107144813.

\* cited by examiner

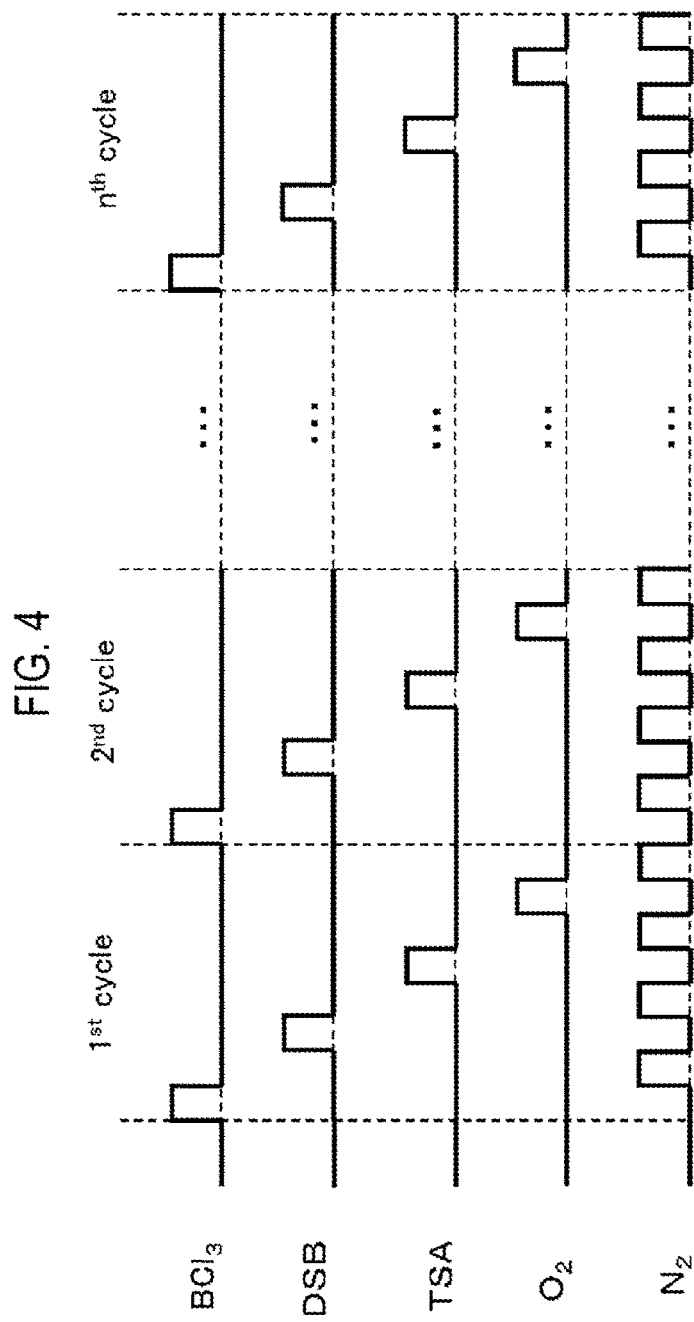

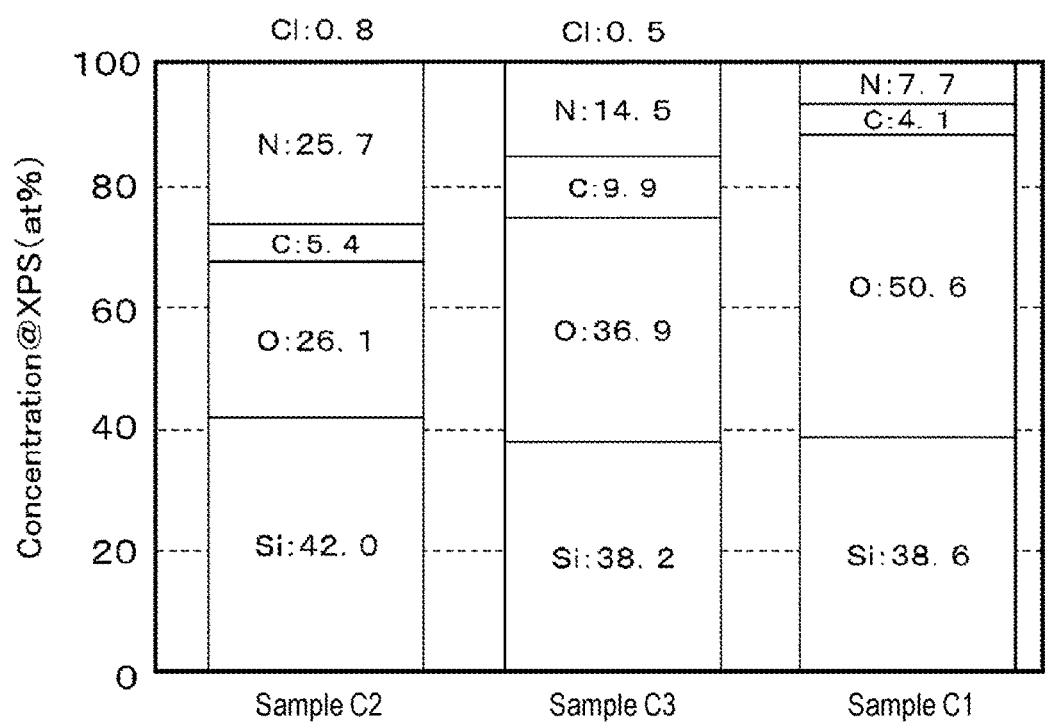

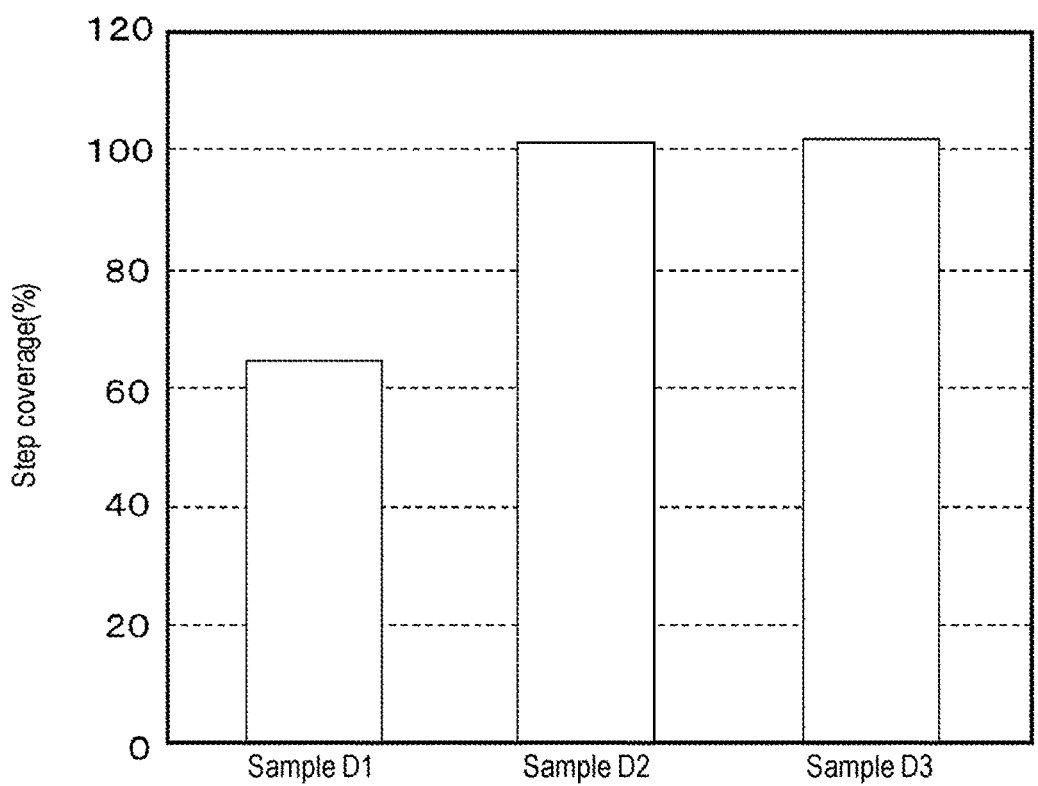

METHOD OF PROCESSING SUBSTRATE AND MANUFACTURING SEMICONDUCTOR DEVICE BY FORMING FILM CONTAINING SILICON

CROSS-REFERENCE TO RELATED APPLICATION

This application is based upon and claims the benefit of priority from Japanese Patent Application No. 2017-243929, filed on Dec. 20, 2017, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes of manufacturing a semiconductor device, a process of forming a film on a substrate is often carried out.

SUMMARY

Some embodiments of the present disclosure provide a technique capable of improving the quality of a film formed on a substrate.

According to one embodiment of the present disclosure, there is provided a technique of forming a film containing Si, C and N on a substrate by performing a cycle a predetermined number of times, the cycle including non-simultaneously performing: (a) supplying a first precursor containing a Si—C bond and not containing halogen to the substrate; and (b) supplying a second precursor containing a Si—N bond and not containing an alkyl group to the substrate, wherein (a) and (b) are performed under a condition that at least a part of the Si—C bond in the first precursor and at least a part of the Si—N bond in the second gas are held without being cut.

BRIEF DESCRIPTION OF DRAWINGS

FIG. 4 is a diagram showing a film-forming sequence according to an embodiment of the present disclosure.

FIGS. SA to 5F are views showing a chemical structural formula of 1,3-disilapropane, a chemical structural formula of 1,4-disilabutane, a chemical structural formula of 1,3-disilabutane, a chemical structural formula of 1,3,5-trisilapentane, a chemical structural formula of 1,3,5-trisilacyclohexane, and a chemical structural formula of 1,3-disilacyclobutane, respectively.

Figure 6A:
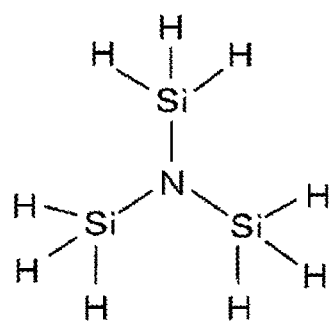
Figure 6B:
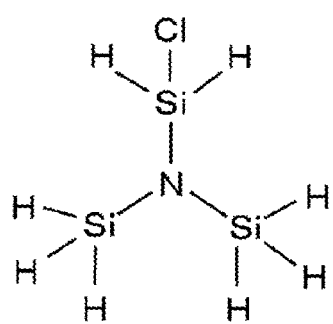

FIGS. 6A and 6B are views showing a chemical structural formula of trisilylamine and a chemical structural formula of monochlorotrisilylamine, respectively.

Figure 7:
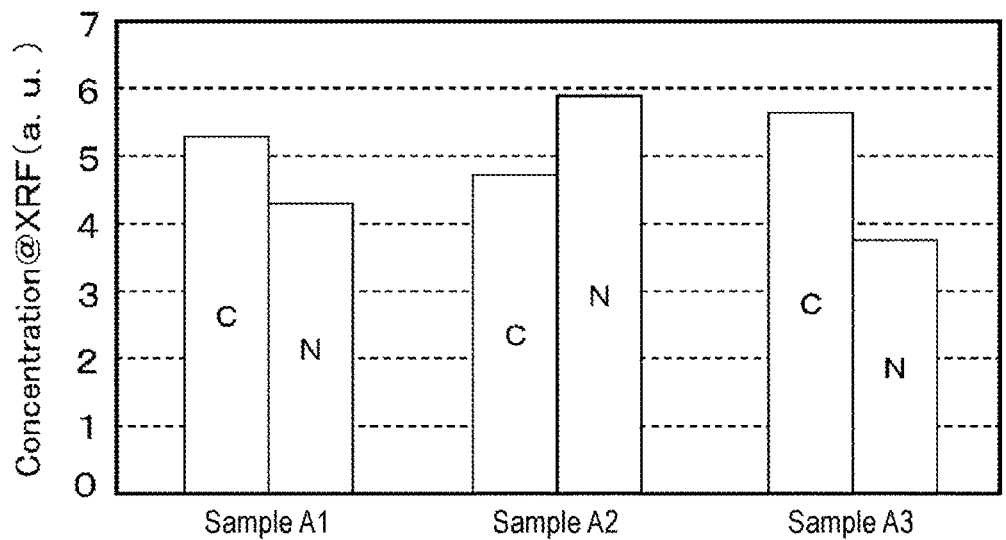

FIG. 7 is a view showing results of measurement of C concentration and N concentration of a film formed on a substrate.

Figure 8:
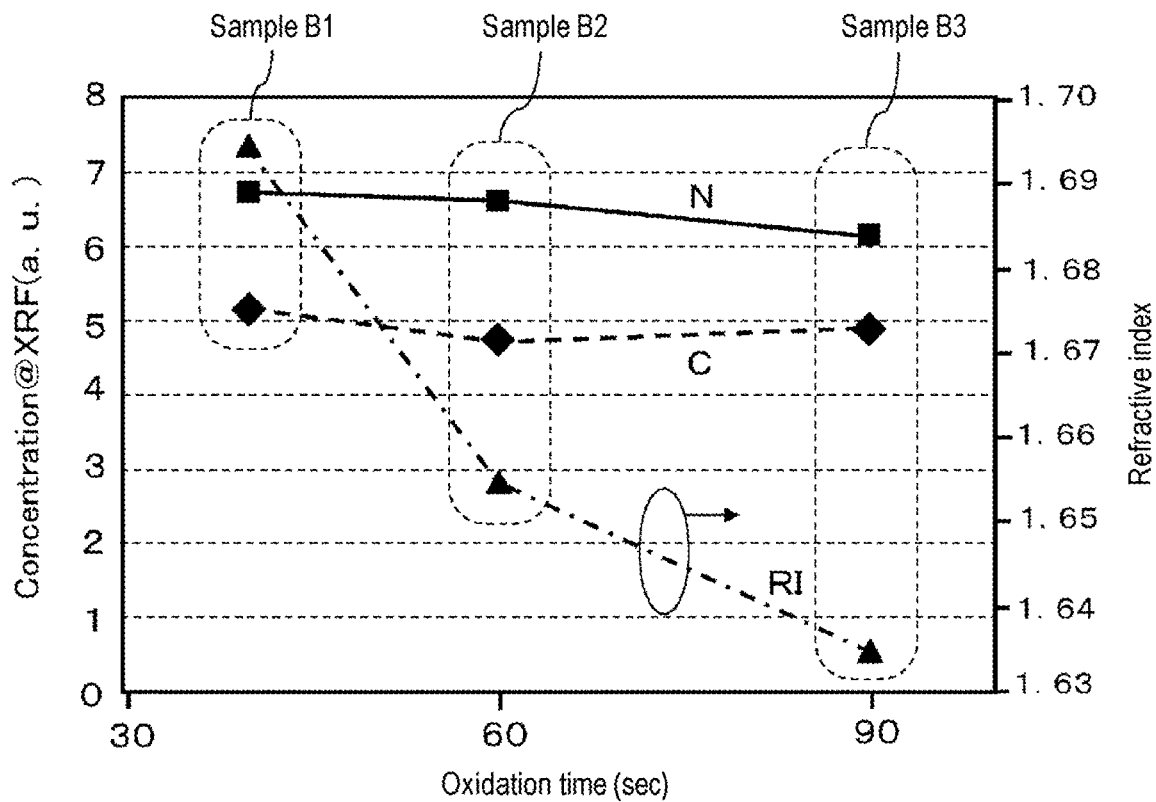

FIG. 8 is a view showing results of measurement of C concentration, N concentration and refractive index of a film formed on a substrate.

Figure 9B:
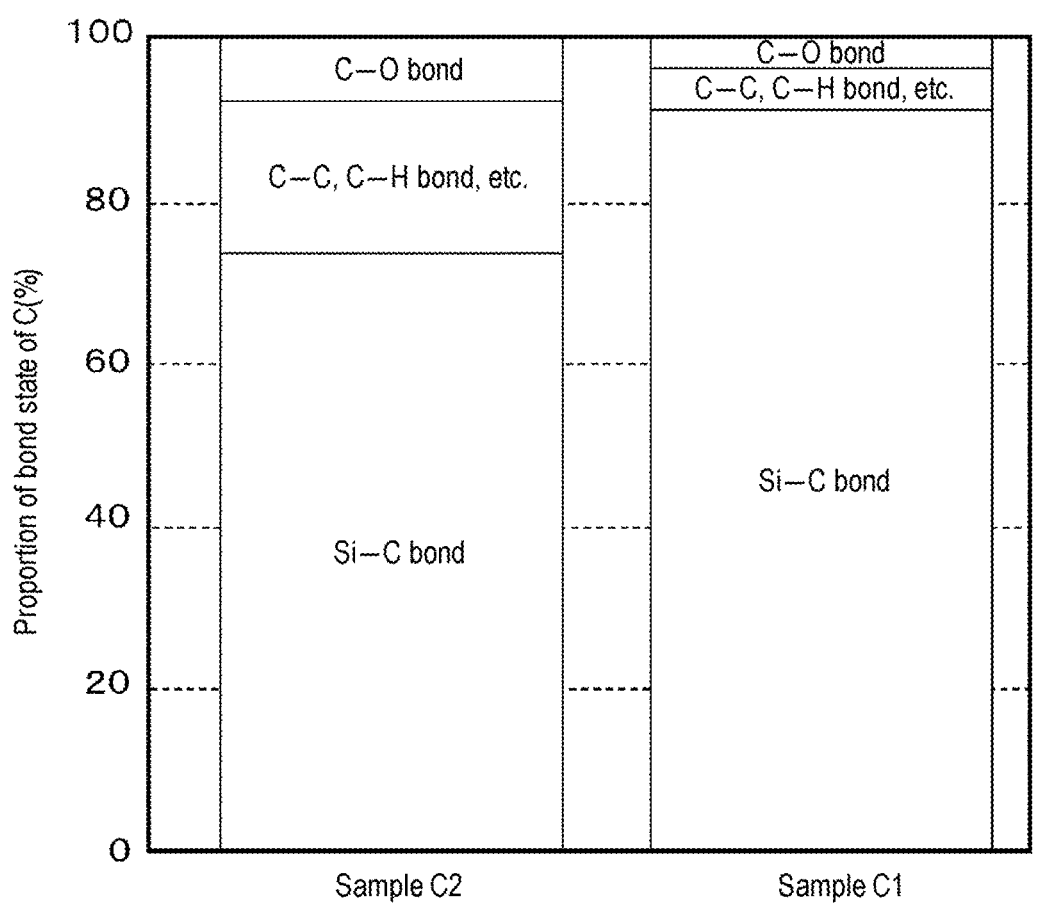

FIGS. 9A and 9B are views showing results of measurement of the composition ratio of a film formed on a substrate, and results of measurement of the proportion of the bonding state of carbon contained in the film formed on the substrate.

FIG. 10 is a view showing results of measurement of step coverage of a film formed on a substrate.

DETAILED DESCRIPTION

One Embodiment of the Present Disclosure

One embodiment of the present disclosure will be now described mainly with reference to FIGS. 1 to 5.

(1) Configuration of Substrate Processing Apparatus

Figure 1:
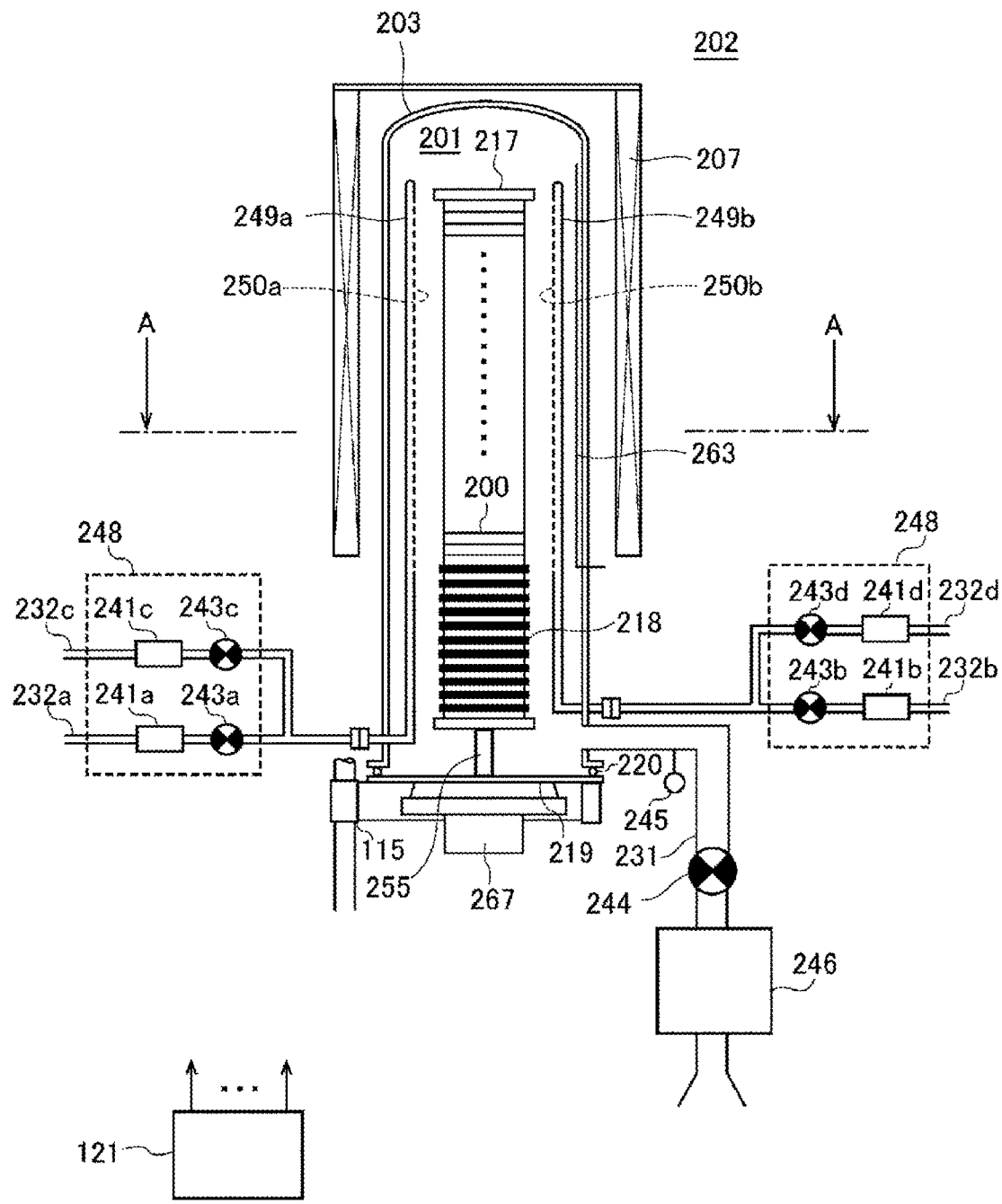
FIG. 1 is a schematic configuration view of a vertical process furnace of a substrate processing apparatus suitably used in one embodiment of the present disclosure, in which a portion of the process furnace is shown in a vertical cross section.

As shown in FIG. 1, a process furnace 202 includes a heater 207 as a heating mechanism (a temperature adjustment part). The heater 207 has a cylindrical shape and is supported by a support plate so as to be vertically installed. The heater 207 functions as an activation mechanism (an excitation part) configured to thermally activate (excite) a gas.

A reaction tube 203 is disposed inside the heater 207 in a concentric relationship with the heater 207. The reaction tube 203 is made of a heat resistant material such as quartz ($SiO_2$) or silicon carbide (SiC) and is formed in a cylindrical shape with its upper end closed and its lower end opened. A process chamber 201 is formed in a hollow cylindrical portion of the reaction tube 203. The process chamber 201 is configured to accommodate wafers 200 as substrates. Processing on the wafers 200 is performed in the process chamber 201.

Nozzles 249a and 249b are installed in the process chamber 201 so as to pass through the lower side wall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are sequentially installed in the gas supply pipes 232a and 232b, respectively, from the upstream sides. Gas supply pipes 232c and 232d are connected to the gas supply pipes 232a and 232b, respectively, at downstream sides of the valves 243a and 243b. MFCs 241c and 241d and valves 243c and 243d are sequentially installed in the gas supply pipes 232c and 232d, respectively, from upstream sides.

Figure 2:
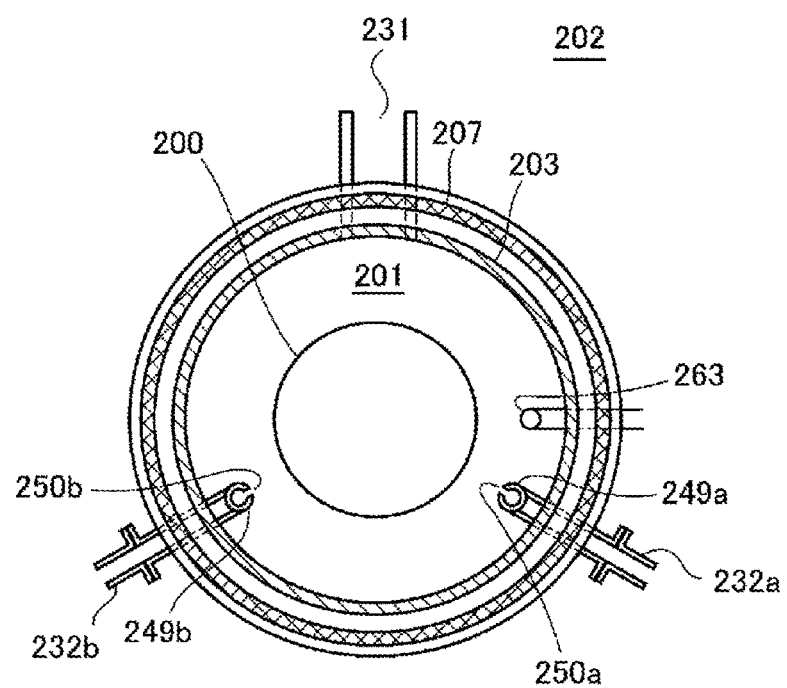
FIG. 2 is a schematic configuration view of the vertical process furnace of the substrate processing apparatus suitably used in one embodiment of the present disclosure, in which a portion of the process furnace is shown in a cross section taken along line A-A in FIG. 1.

As shown in FIG. 2, the nozzles 249a and 249b are disposed in an annular space between the inner wall of the reaction tube 203 and the wafers 200 such that the nozzles 249a and 249b extend upward along a stack direction of the wafers 200 from a lower portion of the inner wall of the reaction tube 203 to an upper portion thereof. Specifically, the nozzles 249a and 249b are installed in a region horizontally surrounding a wafer arrangement region in which the wafers 200 are arranged at a lateral side of the wafer arrangement region, along the wafer arrangement region. Gas supply holes 250a and 250b for supplying a gas are respectively formed on the side surfaces of the nozzles 249a and 249b. The gas supply holes 250a and 250b are opened toward the center of the reaction tube 203 to allow the gas to be supplied toward the wafers 200. A plurality of gas supply holes 250a and 250b may be formed between the lower portion of the reaction tube 203 and the upper portion thereof.

A first precursor (first precursor gas) containing a chemical bond (Si—C bond) between silicon (Si) as a main element constituting a film formed on the wafers 200 and carbon (C), and not containing a halogen element such as chlorine (Cl), fluorine (F), bromine (Br), iodine (I) or the like, is supplied from the gas supply pipe 232a into the process chamber 201 via the MFC 241a, the valve 243a and the nozzle 249a. The precursor gas is a gaseous gas, for example, a gas obtained by vaporizing a precursor in a liquid state under room temperature and atmospheric pressure, or a precursor in a gaseous state under room temperature and atmospheric pressure. As the first precursor gas, it may be possible to use, e.g., a 1,4-disilabutane ($SiH_3CH_2CH_2SiH_3$, abbreviation: 1,4-DSB) gas. As shown in a chemical structural formula in FIG. 5B, the 1,4-DSB is a substance containing Si—C bonds, chemical bonds (Si—H bonds) between Si and hydrogen (H), chemical bonds (C—H bonds) between C and H and the like. For example, it contains two Si—C bonds, six Si—H bonds and four C—H bonds in one molecule. The 1,4-DSB contains an ethylene group ($C_2H_4$) as an alkylene group and is also an alkyl group-free precursor to be described later. Among four bonding hands of C in the 1,4-DSB, one bonding hand constitutes a Si—C bond and two bonding hands constitute a C—H bond. In the present disclosure, the 1,4-DSB is also simply referred to as a DSB. The DSB acts as a Si source and a C source in a substrate processing process to be described later.

A second precursor (second precursor gas) containing a chemical bond (Si—C bond) between Si and nitrogen (N) and not containing an alkyl group such as a methyl group, an ethyl group, a propyl group, an isopropyl group, a butyl group, an isobutyl group or the like is supplied from the gas supply pipe 232a into the process chamber 201 via the MFC 241a, the valve 243a and the nozzle 249a. As the second precursor gas, it may be possible to use, e.g., a trisilylamine ($N(SiH_3)_3$, abbreviation: TSA) gas. As shown in a chemical structural formula in FIG. 6A, the TSA is a substance containing Si—N bonds and Si—H bonds, and contains three Si—N bonds and nine Si—H bonds in one molecule. The TSA is also a halogen-free precursor. Three Si atoms are bonded to one N atom (center element) in the TSA. The TSA acts as a Si source and an N source in a substrate processing process to be described later.

As a reactant (reaction gas), for example, an oxygen (O)-containing gas is supplied from the gas supply pipe 232b into the process chamber 201 via the MFC 241b, the valve 243b and the nozzle 249b. The O-containing gas acts as an oxidizing agent (oxidizing gas), that is, an O source. As the O-containing gas, it may be possible to use, e.g., an oxygen ($O_2$) gas.

As a catalyst (catalyst gas), for example, a trichloroborane ($BCl_3$) gas, which is one type of haloborane, is supplied from the gas supply pipe 232b into the process chamber 201 via the MFC 241b, the valve 243b and the nozzle 249b. The $BCl_3$ gas demonstrates a catalytic action to promote formation of a film on the wafers 200 in a substrate processing process to be described later. However, the molecular structure of the $BCl_3$ gas may be partially decomposed during a film-forming process. Such a gas whose part varies before and after the chemical reaction is not strictly a catalyst. However, in the present disclosure, even when the molecular structure of the $BCl_3$ gas is partially decomposed during the chemical reaction, most of the gas is not decomposed and changes the reaction rate. Therefore, the $BCl_3$ gas may be referred to as a substance substantially acting as a catalyst.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b and the nozzles 249a and 249b. The $N_2$ gas acts as a purge gas, a carrier gas, a dilution gas, or the like.

A first precursor supply system and a second precursor supply system are mainly constituted by the gas supply pipe 232a, the MFC 241a and the valve 243a. A reactant supply system (oxidizing agent supply system) and a catalyst supply system are mainly constituted by the gas supply pipe 232b, the MFC 241b and the valves 243b. An inert gas supply system is mainly constituted by the gas supply pipes 232c and 232d, the MFCs 241c and 241d and the valves 243c and 243d.

Either or all of the above-described various supply systems may be configured as an integrated supply system 248 in which the valves 243a to 243d, the MFCs 241a to 241d and the like are integrated. The integrated supply system 248 is connected to each of the gas supply pipes 232a to 232d and is configured such that the operations of supplying various gases into the gas supply pipes 232a to 232d, such as the opening and closing operation of the valves 243a to 243d and the flow rate regulating operation by the MFCs 241a to 241d and the like, are controlled by a controller 121 which will be described later. The integrated supply system 248 is configured as an integral type or division type integrated unit and can be attached to and detached from the gas supply pipes 232a to 232d or the like on an integrated unit basis. Further, the maintenance, replacement, extension and the like of the integrated supply system 248 can be performed on an integrated unit basis.

An exhaust pipe 231 for exhausting the internal atmosphere of the process chamber 201 is connected to the lower side of the side wall of the reaction tube 203. A vacuum pump 246 as a vacuum exhaust device is connected to the exhaust pipe 231 via a pressure sensor 245 as a pressure detector (pressure detecting part) for detecting the internal pressure of the process chamber 201, and an auto pressure controller (APC) valve 244 as a pressure regulator (pressure regulating part). The APC valve 244 is configured to perform or stop vacuum exhaust in the process chamber 201 by opening or closing the valve while the vacuum pump 246 is actuated, and is also configured to regulate the internal pressure of the process chamber 201 by adjusting the opening degree of the valve based on pressure information detected by the pressure sensor 245 while the vacuum pump 246 is actuated. An exhaust system is mainly constituted by the exhaust pipe 231, the APC valve 244 and the pressure sensor 245. The vacuum pump 246 may be included in the exhaust system.

A seal cap 219, which serves as a furnace opening cover configured to hermetically seal the lower end opening of the reaction tube 203, is installed under the reaction tube 203. The seal cap 219 is made of metal such as, for example, SUS or the like, and is formed in a disc shape. An O-ring 220, which is a seal member making contact with the lower end of the reaction tube 203, is installed on the upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevating instrument installed outside the reaction tube 203. The boat elevator 215 is configured as a transfer device (transfer mechanism) which loads and unloads (transfers) the wafers 200 into and from the process chamber 201 by moving the seal cap 219 up and down.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz, SiC or the like. Heat insulating plates 218 made of a heat resistant material such as quartz, SiC or the like are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
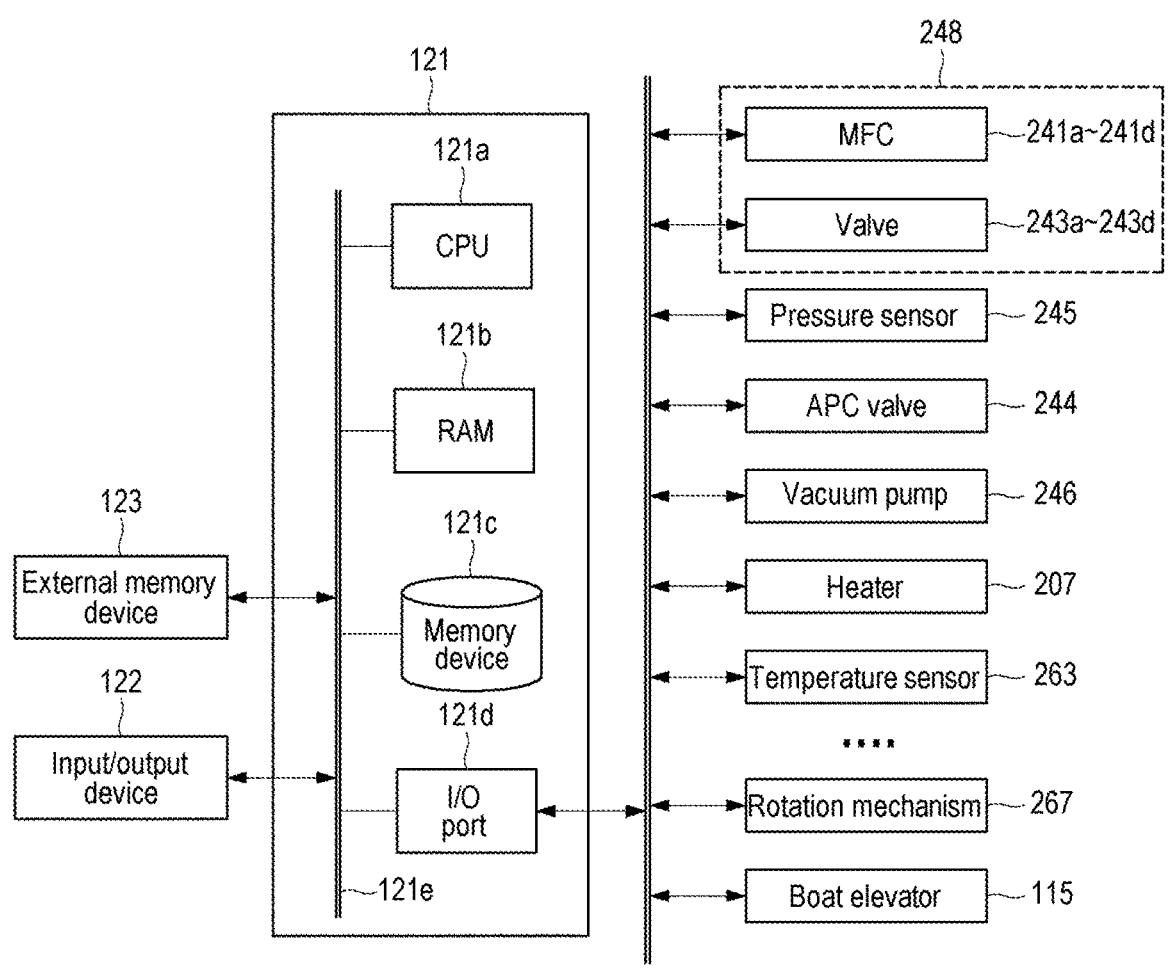
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control unit), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 formed of, for example, a touch panel or the like, is connected to the controller 121.

The memory device 121c is configured with, for example, a flash memory, a hard disk drive (HDD) or the like. A control program for controlling operations of a substrate processing apparatus and a process recipe, in which sequences and conditions of substrate processing to be described later are written, are readably stored in the memory device 121c. The process recipe function as a program for causing the controller 121 to execute each sequence in the substrate processing process, which will be described later, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, and so on.

The CPU 121a is configured to read and execute the control program from the memory device 121c. The CPU 121a is also configured to read the recipe from the memory device 121c according to an input of an operation command from the input/output device 122. The CPU 121a is configured to control the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and so on, according to contents of the read recipe.

The controller 121 may be configured by installing, on a computer, the aforementioned program stored in an external memory device 123 (for example, a magnetic disk such as a hard disk, an optical disk such as a CD, a magneto-optical disk such as an MO, a semiconductor memory such as a USB memory, or the like). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Alternatively, the program may be supplied to the computer using communication means such as the Internet or a dedicated line, instead of using the external memory device 123.

(2) Substrate Processing Process

A sequence example of forming a film on a wafer 200 as a substrate, which is one of the processes for manufacturing a semiconductor device, that is, a film-forming sequence example, using the aforementioned substrate processing apparatus will be described below with reference to FIG. 4. In the following description, the operations of the respective parts constituting the substrate processing apparatus are controlled by the controller 121.

In the film-forming sequence shown in FIG. 4, a film containing Si, C and N is formed on the wafer 200 by performing a cycle a predetermined number of times, the cycle including non-simultaneously performing:

(a) a step of supplying a DSB gas as a first precursor containing a Si—C bond and not containing halogen to the wafer 200, and (b) a step of supplying a TSA gas as a second precursor containing a Si—N bond and not containing an alkyl group to the wafer 200, under a condition that at least a part of the Si—C bond in the DSB gas and at least a part of the Si—N bond in the TSA gas are held without being cut.

In addition, the cycle performed in the film-forming sequence shown in FIG. 4 includes performing:

(c) a step of supplying an $O_2$ gas as an oxidizing agent to the wafer 200 non-simultaneously with each of the steps (a) and (b). In this case, the film formed on the wafer 200 further contains O and becomes a film containing Si, O, C and N, that is, a silicon oxycarbonitride film (SiOCN film).

Further, the cycle performed in the film-forming sequence shown in FIG. 4 includes performing, before performing at least one selected from the group of the step (a) and the step (b):

(d) a step of supplying a BCl$_3$ gas as a catalyst to the wafer 200. As an example, FIG. 4 shows a case where the step (d) is performed before the step (a) and is not performed after the step (a) and before the step (b).

In the present disclosure, the film-forming sequence shown in FIG. 4 may be expressed as follows for the sake of convenience. The same notation is used for film-forming sequences in other embodiments to be described later.

(BCl$_3$→DSB→TSA→O$_2$)×$n$⇒SiOCN

When the term "wafer" is used in the present disclosure, it may refer to "a wafer itself" or "a wafer and a laminated body of predetermined layers or films formed on a surface of the wafer." When the phrase "a surface of a wafer" is used in the present disclosure, it may refer to "a surface of a wafer itself" or "a surface of a predetermined layer formed on a wafer." When the expression "a predetermined layer is formed on a wafer" is used in the present disclosure, it may mean that "a predetermined layer is directly formed on a surface of a wafer itself" or that "a predetermined layer is formed on a layer formed on a wafer." When the term "substrate" is used in the present disclosure, it may be synonymous with the term "wafer."

(Wafer Charging and Boat Loading)

A plurality of wafers 200 is charged in the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 through the O-ring 220.

(Pressure Adjustment and Temperature Adjustment)

The interior of the process chamber 201, namely, a space in which the wafers 200 exist, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 begins. The actuation of the vacuum pump 246 and the heating and rotation of the wafers 200 may be continuously performed at least until the processing of the wafers 200 is completed.

(Film-Forming Step)

Thereafter, the following steps 1 to 4 are sequentially executed.

[Step 1]

In this step, a BCl$_3$ gas is supplied to a wafer 200 in the process chamber 201. Specifically, the valve 243$b$ is opened to allow the BCl$_3$ gas flow into the gas supply pipe 232$b$. The flow rate of the BCl$_3$ gas is adjusted by the MFC 241$b$, and the BCl$_3$ gas is supplied into the process chamber 201 via the nozzle 249$b$ and is exhausted from the exhaust pipe 231. At this time, the BCl$_3$ gas is supplied to the wafer 200. At the same time, the valves 243$c$ and 243$d$ may be opened to allow an N$_2$ gas to flow into the gas supply pipes 232$c$ and 232$d$.

The process condition of this step is exemplified as follows.

BCl$_3$ gas supply flow rate: 1 to 2,000 sccm
N$_2$ gas supply flow rate (each gas supply pipe): 0 to 10,000 sccm
Each gas supply time: 1 to 120 seconds
Processing temperature: 400 degrees C. to 450 degrees C., specifically 425 to 450 degrees C.
Processing pressure: 1 to 2,000 Pa By supplying the BCl$_3$ gas to the wafer 200 under the above-described condition, it is possible to adsorb BCl$_3$ onto the outermost surface of the wafer 200 while suppressing decomposition of the BCl$_3$ gas in a gas phase in the process chamber 201, that is, thermal decomposition. Thus, it is possible to form a layer containing B and Cl as a first layer (initial layer) on the wafer 200. The first layer is a layer containing BCl$_3$ physically adsorbed onto the wafer 200 or a substance generated when BCl$_3$ is chemisorbed onto the wafer 200. These substances adsorbed onto the surface of the wafer 200 act as a catalysts for advancing a film-forming reaction (formation reaction of a second layer and a third layer to be described later) on the surface of the wafer 200 in steps 2 and 3 to be described later. Hereinafter, these substances acting as a catalyst are also referred to as BCl$_x$ ($x$ is 1 to 3) for convenience.

After forming the first layer on the wafer 200, the valve 243$b$ is closed to stop the supply of BCl$_3$ gas into the process chamber 201. Then, the interior of the process chamber 201 is vacuum-exhausted to exclude the gas or the like remaining in the process chamber 201 from the interior of the process chamber 201. At this time, the valves 243$c$ and 243$d$ are opened to supply a N$_2$ gas into the process chamber 201. The N$_2$ gas acts as a purge gas. Thus, it is possible to remove the BC % gas floating in the process chamber 201. This makes it possible to perform the step 2 to be described later in a state (no floating state) in which the BCl$_3$ gas is not floating in the process chamber 201.

As the catalyst, in addition to the BCl$_3$ gas, it may be possible to use, for example, a monochloroborane (BClH$_2$) gas, a dichloroborane (BCl$_2$H) gas, a trifluoroborane (BF$_3$) gas, a tribromoborane (BBr$_3$) gas, a diborane (B$_2$H$_6$) gas or the like.

As the inert gas, in addition to the N$_2$ gas, it may be possible to use, e.g., a rare gas such as an Ar gas, a He gas, a Ne gas, a Xe gas or the like. This also applies to the steps 2 to 4 and a post-treatment step to be described below.

[Step 2]

In this step, a DSB gas is supplied to the wafer 200 in the process chamber 201, that is, the first layer formed on the wafer 200, in a state where the BCl$_3$ gas is not floating in the process chamber 201. Specifically, the opening/closing control of the valves 243$a$, 243$c$ and 243$d$ is performed in the same procedure as the opening/closing control of the valves 243$b$ to 243$d$ in the step 1. The flow rate of the DSB gas is adjusted by the MFC 241$a$, and the DSB gas is supplied into the process chamber 201 via the nozzle 249$a$ and is exhausted from the exhaust pipe 231. At this time, the DSB gas is supplied to the wafer 200.

The process condition of this step is exemplified as follows.

DSB gas supply flow rate: 1 to 2,000 sccm
DSB gas supply time: 1 to 300 seconds
Processing pressure: 1 to 4,000 Pa
Other process condition is the same as what is described in the step 1.

By supplying the DSB gas to the wafer 200 under the above-described condition, a catalytic reaction is caused by the catalytic action of BCl$_x$ contained in the first layer, which makes it possible to decompose a part of the molecular structure of DSB. Then, it is possible to adsorb (chemically adsorb) a substance, which is generated by the decomposition of a part of the molecular structure of the DSB, for example, a first intermediate containing a Si—C bond and the like, on the surface of the wafer 200. This makes it possible to modify the first layer to form a silicon carbide layer (SiC layer), which is a layer containing Si and C, as a second layer on the wafer 200. Since the DSB gas is terminated by a Si—H bond and a C—H bond, it has a property to be hardly adsorbed onto the surface of the wafer 200, but it is efficiently adsorbed onto the surface of the wafer 200 by using the catalytic action of $BCl_x$. In this way, the formation reaction of the second layer advances by the catalytic action of $BCl_x$ which has been previously adsorbed onto the surface of the wafer 200, and a surface reaction is main, not a gas phase reaction. At this time, since $BCl_3$ does not float in the process chamber 201, it is possible to more surely advance the formation reaction of the second layer not by the gas phase reaction but by the surface reaction.

Under the above-described condition, at least a part of the Si—C bond of the DSB gas is held without being cut. Therefore, the second layer is a layer containing Si and C in the form of Si—C bond. In addition, under the above-described condition, a part of $BCl_x$ contained in the first layer can be left in the second layer without disappearing. As a result, the second layer is a layer including $BCl_x$. BClx contained in the second layer acts as a catalyst for advancing a film formation reaction (formation reaction of the third layer) in the step 3 to be described later. The second layer can also be referred to as a SiC layer containing $BCl_x$.

After forming the second layer on the wafer 200, the valve 243a is closed to stop the supply of DSB gas into the process chamber 201. Then, according to the same procedure as the step 1, the gas or the like remaining in the process chamber 201 is excluded from the interior of the process chamber 201.

Figure 5A:
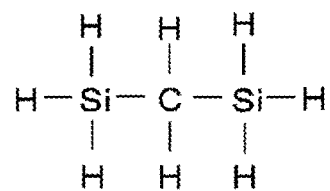
Figure 5B:
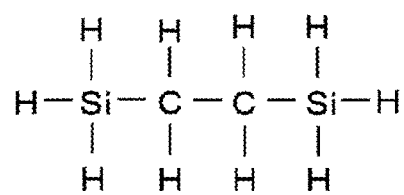
Figure 5C:
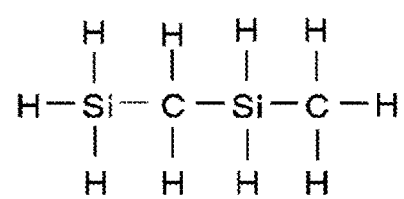
Figure 5D:
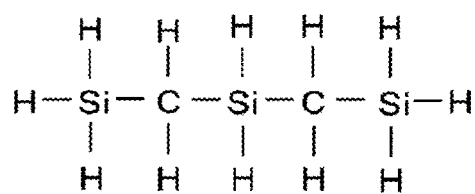
Figure 5E:
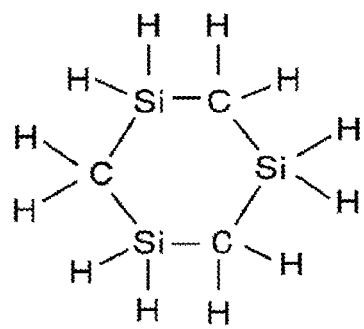
Figure 5F:
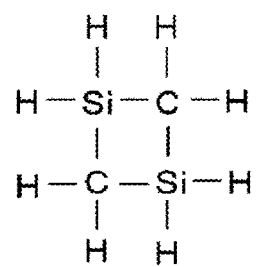

As the first precursor, in addition to the DSB gas, it may be possible to use, for example, a 1,3-disilapropane ($SiH_3CH_2SiH_3$, abbreviation: 1,3-DSP) gas, a 1,3-disilabutane ($SiH_3CH_2SiH_2CH_3$, abbreviation: 1,3-DSB) gas, a 1,3,5-trisilapentane ($SiH_3CH_2SiH_2CH_2SiH_3$, abbreviation: 1,3,5-TSP) gas, a 1,3,5-trisilacyclohexane ($SiH_2CH_2SiH_2CH_2SiH_2CH_2$, abbreviation: 1,3,5-TSCH) gas, a 1,3-disilacyclobutane ($SiH_2CH_2SiH_2CH_2$, abbreviation: 1,3-DSCB) gas, or the like. FIG. 5A shows the chemical structural formula of 1,3-DSP, FIG. 5C shows the chemical structural formula of 1,3-DSB, FIG. 5D shows the chemical structural formula of 1,3,5-TSP, FIG. 5E shows the chemical structural formula of 1,3,5-TSCH, and FIG. 5 (f) shows the chemical structural formula of 1,3-DSCB. These gases contain a Si—C bond and are a halogen-free substance. The substances shown in FIGS. 5A to 5F hardly or do not contain bonds which may cause deterioration of ashing resistance, wet etching resistance, dry etching resistance, etc. (hereinafter collectively referred to as processing resistance) of a SiOCN film formed on the wafer 200, for example, a bond between C and C bonded to two or more, specifically three or more, more specifically all (four) bonding hands (this bond is hereinafter simply referred to as a C—C bond), a chemical bond (C—O bond) between C and O, a chemical bond (Si—R bond) between Si and an alkyl group (R), a chemical bond (N—H bond) between N and H and a chemical bond (N—O bond) between N and O.

[Step 3]

In this step, a TSA gas is supplied to the wafer 200 in the process chamber 201, that is, the second layer formed on the wafer 200. Specifically, the opening/closing control of the valves 243a, 243c and 243d is performed in the same procedure as the opening/closing control of the valves 243b to 243d in the step 1. The flow rate of the TSA gas is adjusted by the MFC 241a and the TSA gas is supplied into the process chamber 201 via the nozzle 249a and is exhausted from the exhaust pipe 231. At this time, the TSA gas is supplied to the wafer 200.

The process condition of this step is exemplified as follows.

TSA gas supply flow rate: 1 to 2,000 sccm
TSA gas supply time: 1 to 300 seconds
Processing pressure: 1 to 2,000 Pa
Other process condition is the same as what is descried in the step 1.

By supplying the TSA gas to the wafer 200 under the above-described condition, a catalytic reaction is caused by the catalytic action of $BCl_x$ contained in the second layer, which makes it possible to decompose a part of the molecular structure of TSA. Then, it is possible to adsorb (chemically adsorb) a substance, which is generated by the decomposition of a part of the molecular structure of the TSA, for example, a second intermediate containing a Si—N bond and the like, onto the surface of the wafer 200. This makes it possible to modify the second layer and allow the second layer to grow, thereby forming a silicon carbonitride layer (SiCN layer), which is a layer containing Si, C and N, as a third layer on the wafer 200. Since the TSA gas is terminated by a Si—H bond, it has a property to be hardly adsorbed onto the surface of the wafer 200, but it is efficiently adsorbed onto the surface of the wafer 200 by using the catalytic action of $BCl_x$. In this way, the formation reaction of the third layer advances by the catalytic action of $BCl_x$ left in the second layer, and a surface reaction is main, not a gas phase reaction.

Under the above-described condition, at least a part of the Si—N bond of the TSA gas is held without being cut. Therefore, the third layer is a layer containing Si and N in the form of Si—N bond. In addition, under the above-described condition, at least a part of the Si—C bond contained in the second layer is held without being cut. Therefore, the third layer is a layer containing Si and C in the form of Si—C bond. In addition, under the above-described condition, most or all of $BCl_x$ contained in the second layer is consumed and removed from the second layer during the reaction with the TSA gas. The amount of $BCl_x$ contained in the third layer drops to an impurity level.

After forming the third layer on the wafer 200, the valve 243a is closed to stop the supply of TSA gas into the process chamber 201. Then, according to the same procedure as the step 1, the gas or the like remaining in the process chamber 201 is excluded from the interior of the process chamber 201.

As the second precursor, in addition to the TSA gas, it may be possible to use a monochlorosilylamine ($N(SiH_3)_2SiH_2Cl$) gas or the like. FIG. 6B shows the chemical structural formula of monochlorosilylamine. Monochlorosilylamine is a substance containing three Si—N bonds in one molecule and containing no alkyl group. As shown in FIGS. 6A and 6B, this substance does not contain the above-mentioned bonds which may cause deterioration of processing resistance of a SiOCN film formed on the wafer 200, for example, the C—C bond, the C—O bond, the Si—R bond (R is an alkyl group), the N—H bond and the N—O bond.

[Step 4]

In this step, an $O_2$ gas is supplied to the wafer 200 in the process chamber 201, that is, the third layer formed on the wafer 200. Specifically, the opening/closing control of the valves 243b to 243d is performed in the same procedure as the opening/closing control of the valves 243b to 243d in the step 1. The flow rate of the $O_2$ gas is adjusted by the MFC 241b, and the $O_2$ gas is supplied into the process chamber 201 via the nozzle 249b and is exhausted from the exhaust pipe 231. At this time, the $O_2$ gas is supplied to the wafer 200.

The process condition of this step is exemplified as follows.

$O_2$ gas supply flow rate: 1 to 10,000 sccm
$O_2$ gas supply time: 1 to 300 seconds
Processing pressure: 1 to 4,000 Pa
Other process condition is the same as what is described in the step 1.

By supplying the $O_2$ gas to the wafer 200 under the above-described condition, at least a part of the third layer formed on the wafer 200 can be modified (oxidized). This makes it possible to desorb impurities such as H, B, Cl and the like from the third layer and introduce the O component contained in the $O_2$ gas into the third layer. By the oxidation of the third layer, it is possible to form a silicon oxycarbonitride layer (SiOCN layer), which is a layer containing Si, O, C and N, as a fourth layer on the wafer 200.

Under the above-described condition, at least a part of each of the Si—C bond and the Si—N bond contained in the third layer is held without being cut. Therefore, the fourth layer is a layer containing a Si—C bond and a Si—N bond.

After forming the fourth layer on the wafer 200, the valve 243b is closed to stop the supply of $O_2$ gas into the process chamber 201. Then, according to the same procedure as the step 1, the gas or the like remaining in the process chamber 201 is excluded from the interior of the process chamber 201.

As the oxidizing agent, in addition to the $O_2$ gas, it may be possible to use a nitrous oxide ($N_2O$) gas, a nitric oxide (NO) gas, a nitrogen dioxide ($NO_2$) gas, a carbon monoxide (CO) gas, a carbon dioxide ($CO_2$) gas, an ozone ($O_3$) gas, a hydrogen peroxide ($H_2O_2$) gas, water vapor ($H_2O$ gas), an $O_2$ gas+hydrogen ($H_2$) gas, or the like.

(Performing Predetermined Number of Times)

A cycle that non-simultaneously, i.e., asynchronously, performs the steps 1 to 4 is performed a predetermined number of times (n times, n is an integer of one or more) to thereby form a SiOCN film having a desired film thickness and a desired composition on the wafer 200. This cycle may be repeated multiple times. That is, the thickness of the fourth film formed per one cycle may be set to be smaller than a desired film thickness. Thus, the above cycle may be repeated multiple times until the film thickness of a SiOCN film formed by laminating the fourth layer becomes equal to the desired film thickness.

The process condition shown in the film-forming step is condition that at least a part of the Si—C bond of the DSB gas is held without being cut when the DSB gas exists alone in the process chamber 201 in the step 2. In addition, the above-described process condition is also a condition that at least a part of the Si—N bond of the TSA gas is held without being cut when the TSA gas exists alone in the process chamber 201 in the step 3. By performing the film-forming step under such a condition, it is possible to introduce the Si—C bond contained in the DSB gas and the Si— N bond contained in the TSA gas into the SiOCN film in the form as they are.

The process condition shown in the film-forming step is also a condition that the $BCl_3$ gas is adsorbed in the form of $BCl_x$ onto the surface of the wafer 200 without being thermally decomposed (gas phase-decomposed) when the $BCl_3$ gas exists alone in the process chamber 201 in the step 1. By performing the film-forming step under such a condition, it is possible to include $BCl_x$ acting as a catalyst in the first layer formed on the wafer 200. Further, it is possible to increase the wafer in-plane uniformity (hereinafter also simply referred to as in-plane uniformity) of the thickness of the first layer formed on the wafer 200 and to improve the step coverage. As a result, it is possible to efficiently advance the formation reaction of the second and third layers at a uniform rate over the entire surface of the wafer 200. In addition, it is possible to increase the deposition rate of the SiOCN film formed on the wafer 200 and to provide this film with high in-plane film thickness uniformity and excellent step coverage.

When the processing temperature is lower than 400 degree C., it is difficult for $BCl_3$ to be chemically adsorbed onto the surface of the wafer 200 in the step 1, which may make it difficult to form the first layer on the wafer 200. In addition, it is difficult to obtain the catalytic action of $BCl_x$ in the steps 2 and 3, which may make it difficult to form the second and third layers on the wafer 200. As a result, it may be difficult to advance the formation of the SiOCN film on the wafer 200 at a practical deposition rate. By setting the processing temperature to a temperature of 400 degrees C. or higher, these problems can be resolved and it becomes possible to advance the formation of the SiOCN film on the wafer 200 at a practical deposition rate. By setting the processing temperature to a temperature of 425 degrees C. or higher, it becomes possible to further increase the deposition rate of the SiOCN film formed on the wafer 200.

On the other hand, when the processing temperature exceeds 450 degrees C., the thermal decomposition of the precursor advances excessively in the steps 2 and 3, which may make it difficult to advance the formation of the second and third layers under a situation where the surface reaction is main rather than the gas phase reaction. In addition, it may be difficult to hold at least a part of the Si—C bond of the DSB gas or to hold at least a part of the Si—N bond of the TSA gas in the steps 2 and 3. By setting the processing temperature to 450 degrees C. or lower, it is possible to resolve these problems. As a result, it is possible to improve the in-plane film thickness uniformity and the step coverage of the SiOCN film formed on the wafer 200. Further, it is easy to introduce the Si—C bond and the Si—N bond into the SiOCN film formed on the wafer 200.

Therefore, the processing temperature in the film-forming step may be set to a temperature within the range of, for example, 400 degrees C. to 450 degrees C., more specifically 425 degrees C. to 450 degrees C.

(Post Treatment Step)

After completion of the formation of the SiOCN film on the wafer 200, the temperature of the heater 207 is appropriately adjusted, and the SiOCN film formed on the wafer 200 is subjected to heat treatment (annealing treatment) as post treatment. This step may be performed while opening the valves 243c and 243d to supply a $N_2$ gas into the process chamber 201. This step may be also performed in a state in which the valves 243c and 243d are closed to stop the supply of $N_2$ gas into the process chamber 201. In either case, this step is performed in a state where the valves 243a and 243b are closed to stop the supply of the catalyst, the first precursor, the second precursor and the oxidizing agent into the process chamber 201.

The process condition of this step is exemplified as follows.

N$_2$ gas supply flow rate (per gas supply pipe): 0 to 20,000 sccm
Processing temperature: 600 to 1,000 degrees C.
Processing pressure: 0.1 to 100,000 Pa
Processing time: 1 to 300 minutes
(After-Purge Step and Atmospheric Pressure Returning Step)

After the film-forming step is completed, a N$_2$ gas is supplied into the process chamber 201 from each of the gas supply pipes 232c and 232d and is exhausted from the exhaust pipe 231. Thus, the interior of the process chamber 201 is purged, and the residual gas and the reaction byproducts remaining in the process chamber 201 are removed from the interior of the process chamber 201 (after-purge). Thereafter, the internal atmosphere of the process chamber 201 is substituted with an inert gas (inert gas substitution), and the internal pressure of the process chamber 201 is returned to an atmospheric pressure (return to atmospheric pressure).
(Boat Unload and Wafer Discharge)

Thereafter, the seal cap 219 is moved down by the boat elevator 115 to open the lower end of the reaction tube 203. The processed wafers 200 supported by the boat 217 are unloaded from the lower end of the reaction tube 203 outside of the reaction tube 203 (boat unload). The processed wafers 200 are discharged from the boat 217 (wafer discharge).

(3) Effects According to the Present Embodiment

According to the present embodiment, one or more effects set forth below may be achieved.

(a) By using the DSB gas and the TSA gas under a condition that at least a part of the Si—C bond in the DSB gas and at least a part of the Si—N bond in the TSA gas are held without being cut, it is possible to introduce the Si—C bond in the DSB gas and the Si-bond in the TSA gas into the SiOCN film formed on the wafer 200 in the form as they are. This makes it possible to improve the processing resistance of the SiOCN film formed on the wafer 200.

(b) By performing the film-forming step in a non-plasma atmosphere, it is easy to introduce the respective Si—C bond and Si—N bond into the SiOCN film formed on the wafer 200. This makes it possible to further improve the processing resistance of the SiOCN film formed on the wafer 200.

(c) By using a substance hardly or not containing the C—C bond, the C—O bond, the Si—R bond (R is an alkyl group), the N—H bond and the like, which may cause deterioration of film processing resistance, as the first and second precursors, it is easy to prevent these various bonds from being contained in the SiOCN film formed on the wafer 200. This makes it possible to further improve the processing resistance of the SiOCN film formed on the wafer 200.

It may be possible to form a SiOCN film on the wafer 200 by performing a cycle a predetermined number of times, the cycle including non-simultaneously supplying an alkylchlorosilane-based gas such as a 1,1,2,2-tetrachloro-1,2-dimethyldisilane ((CH$_3$)$_2$Si$_2$Cl$_4$, abbreviation: TCDMDS) gas or the like, an aminosilane-based gas such as a dimethylaminosilane (SiH$_3$[N(CH$_3$)$_2$]) or the like, and an O$_2$ gas to the wafer 200. However, it has been found that the SiOCN film formed by such a method sometimes contains the above-mentioned various kinds of bonds, which may cause deterioration of the film processing resistance, which may make it difficult to obtain the processing resistance as high as that of the SiOCN film formed in the present embodiment. According to the careful studies by the present inventors, it has been found that the C—C bond, the C—O bond and the Si—R bond (R is an alkyl group) contained in the SiOCN film tend to cause, for example, deterioration in the ashing resistance of the film, and the N—H bond contained in the SiOCN film tends to cause, for example, deterioration in the wet etching resistance of the film.

(d) According to the various effects described above, in the present embodiment, even if the addition amount of the C component and the N component in the SiOCN film formed on the wafer 200 is small, it is possible to increase the film processing resistance sufficiently. Further, by reducing the addition amount of the C component and the N component in the SiOCN film, which may cause increase in a dielectric constant, it is possible to provide this film with excellent processing resistance and low dielectric constant (Low-k). In other words, according to the present embodiment, it is possible to achieve both of improvement in processing resistance and reduction in dielectric constant (Low-k) which are likely to have a trade-off relationship.

(e) By performing the step 1 of adsorbing BCl$_x$ onto the surface of the wafer 200 before performing the step 2, that is, at the beginning of each cycle, it is possible to efficiently advance the formation of the second layer in the step 2 by utilizing the catalytic action of BCl$_x$. In addition, by leaving a part of BCl$_x$ contained in the first layer in the second layer when performing the step 2, it is possible to efficiently advance the formation of the third layer in the step 3 by utilizing the catalytic action of BCl$_x$. As a result, it is possible to efficiently advance the formation of the SiOCN film on the wafer 200 at a high deposition rate under the above-described low temperature condition and non-plasma atmosphere. Further, by performing the step 1 before the step 2 but not after the step 2 and before the step 3, it becomes easy to promote incorporation of the Si—C bond than incorporation of the Si—N bond in the SiOCN film formed on the wafer 200.

(f) When performing the step 2, by utilizing the catalytic action of BCl$_x$ adsorbed onto the surface of the wafer 200, the formation of the second layer is allowed to advance by the surface reaction, which can result in improvement of the in-plane uniformity and the step coverage of the second layer. In addition, when performing the step 3, by utilizing the catalytic action of BCl$_x$ left in the second layer, the formation of the third layer is allowed to advance by the surface reaction, which can result in improvement of the in-plane uniformity and the step coverage of the third layer. As a result, it is possible to improve both of the in-plane film thickness uniformity and the step coverage of the SiOCN film formed on the wafer 200.

(g) By performing the steps 1 to 4 non-simultaneously, that is, by sequentially supplying the BCl$_3$ gas, the DSB gas, the TSA gas and the O$_2$ gas to the wafer 200 with the purging process in the process chamber 201 interposed therebetween, it is possible to advance the formation of the SiOCN film on the wafer 200 by the surface reaction rather than the gas phase reaction. In addition, by performing the step of removing the BCl$_3$ gas floating in the process chamber 201 after performing the step 1 and before performing the step 2, that is, by performing the step 2 in a state where the BCl$_3$ gas does not float in the process chamber 201 (a non-floating state), it is possible to more reliably advance the formation of the SiOCN film on the wafer 200 by the surface reaction rather than the gas phase reaction. As a result, it is possible to further improve the in-plane film thickness uniformity and the step coverage of the SiOCN film formed on the wafer 200.

(h) By using the DSB gas as the first precursor which does not act as a N source but acts as a C source and using the TSA gas as the second precursor which does not act as a C source but acts as a N source, it is possible to independently control the amount of the C component and the amount of the N component to be introduced into the SiOCN film formed on the wafer 200. That is, it is possible to enhance the controllability of the composition of the SiOCN film formed on the wafer 200 and to control the composition in a wide range and with precision.

(i) By performing the post-treatment step after performing the film-forming step, it is possible to desorb impurities such as H contained in the SiOCN film formed on the wafer 200 from the film. In addition, it is possible to densify the SiOCN film formed on the wafer 200. As a result, it is possible to further enhance the processing resistance of this film. It is also possible to avoid an increase in the dielectric constant of the film when the SiOCN film formed on the wafer 200 is exposed to the atmosphere.

(j) The above-described effects can be obtained in the same manner even in a case where the catalyst other than the $BCl_3$ gas is used, a case where the first precursor other than the DSB gas is used, a case where the second precursor other than the TSA gas is used, a case where the oxidizing agent other than the $O_2$ gas is used, and a case where the inert gas other than the $N_2$ gas is used.

(4) Modifications

The sequence of the film-forming process in this embodiment is not limited to the aspect shown in FIG. 4 but may be modified as in the following modifications which may be used in proper combination. Unless otherwise specified, the processing procedure and processing condition in each step of each modification are the same as the processing procedure and processing condition in each step of the above-described substrate processing sequence.

(Modification 1)

In the film-forming step, the order of supply of the DSB gas and the TSA gas may be exchanged as in a film-forming sequence shown below. This modification can obtain the same effects as the film-forming sequence shown in FIG. 4. In addition, the step of supplying the $BCl_3$ gas may be performed before the step of supplying the TSA gas but not after the step of supplying the TSA gas and before the step of supplying the DSB gas, which makes it easier to promote the introduction of the Si—N bond than the introduction of the Si—C bond in the SiOCN film formed on the wafer 200.

$(BCl_3 \rightarrow TSA \rightarrow DSB \rightarrow O_2) \times n \Rightarrow SiOCN$ (Modification 2)

In the film-forming step, a film containing Si, C and N, that is, a silicon carbonitride film (SiCN film), may be formed on the wafer 200 without performing the step of supplying the $O_2$ gas, as in film-forming sequences shown below. This modification can also obtain the same effects as the film-forming sequence shown in FIG. 4. It is also possible to make this film Si-rich by increasing the amount of Si relative to the amount of N or C contained in the SiCN film formed on the wafer 200.

$(BCl_3 \rightarrow DSB \rightarrow TSA) \times n \Rightarrow SiCN$ $(BCl_3 \rightarrow TSA \rightarrow DSB) \times n \Rightarrow SiCN$ (Modification 3)

In the film-forming step, the step of supplying the $BCl_3$ gas may not be performed, as in film-forming sequences shown below. Even in this modification, it is possible to introduce the Si—C bond and the Si—N bond into the SiOCN film formed on the wafer 200 and to make the SiOCN film formed on the wafer 200 to be a film with excellent processing resistance. In a case of not using a catalyst, when the processing temperature is lower than 450 degrees C., the SiOCN film may not be formed at a practical deposition rate. By setting the processing temperature to 450 degrees C. or higher, it is possible to form the SiOCN film at a practical deposition rate even when no catalyst is used. In the case where no catalyst is used, if the processing temperature exceeds 470 degrees C., the gas phase reaction becomes excessive, which tends to deteriorate the film thickness uniformity, thereby making it difficult to control the film thickness uniformity. By setting the processing temperature to 470 degrees C. or lower, the deterioration of the film thickness uniformity can be suppressed when no catalyst is used, and its control becomes possible. Therefore, in the case of using no catalyst as in this modification, the processing temperature may be set to a temperature within the range of 450 to 470 degrees C.

$(DSB \rightarrow TSA \rightarrow O_2) \times n \Rightarrow SiOCN$ $(TSA \rightarrow DSB \rightarrow O_2) \times n \Rightarrow SiOCN$ (Modification 4)

In the film-forming step, both of the step of supplying the $BCl_3$ gas and the step of supplying the $O_2$ gas may not be performed, as in film-forming sequences shown below. Even in this modification, it is possible to introduce the Si—C bond and the Si—N bond into the SiCN film formed on the wafer 200 and to make the SiCN film formed on the wafer 200 to be a film with excellent processing resistance. It is also possible to make this film Si-rich by increasing the amount of Si relative to the amount of N or C contained in the film. Even in this modification, for the same reason as in Modification 3, the processing temperature may be set to a temperature within the range of 450 to 470 degrees C.

$(DSB \rightarrow TSA) \times n \Rightarrow \text{Si-rich SiCN}$ $(TSA \rightarrow DSB) \times n \Rightarrow \text{Si-rich SiCN}$ (Modification 5)

In the film-forming step, the step of supplying the $BCl_3$ gas may be performed at both of timing before the step of supplying the DSB gas and timing after the step of supplying the DSB gas before the step of supplying the TSA gas, as in film-forming sequences shown below. In addition, the step of supplying the $BCl_3$ gas may be performed at both of timing before the step of supplying the TSA gas and timing after the step of supplying the TSA gas before the step of supplying the DSB gas. This modification can also obtain the same effects as the film-forming sequence shown in FIG. 4. Further, by supplying the $BCl_3$ gas as a catalyst twice separately before supplying the respective precursors, it is possible to further improve the in-plane film thickness uniformity and the step coverage of the film formed on the wafer 200 and to further increase the deposition rate.

$(BCl_3 \rightarrow DSB \rightarrow BCl_3 \rightarrow TSA \rightarrow O_2) \times n \Rightarrow SiOCN$ $(BCl_3 \rightarrow TSA \rightarrow BCl_3 \rightarrow DSB \rightarrow O_2) \times n \Rightarrow SiOCN$ $(BCl_3 \rightarrow DSB \rightarrow BCl_3 \rightarrow TSA) \times n \Rightarrow SiCN$ $(BCl_3 \rightarrow TSA \rightarrow BCl_3 \rightarrow DSB) \times n \Rightarrow SiCN$ (Modification 6)

In the film-forming step, the step of supplying the $BCl_3$ gas may be performed only during supplying each precursor, but not at the beginning of the cycle, as in film-forming sequences shown below. This modification can also obtain the same effects as the film-forming sequence shown in FIG. 4. In addition, by adopting this modification in a case where the DSB gas is first supplied and the TSA gas is then supplied when each cycle is performed, it is possible to promote the introduction of the Si—N bond while properly suppressing the introduction of the Si—C bond into the film formed on the wafer 200. Further, by adopting this modification in a case where the TSA gas is first supplied and the DSB gas is then supplied when each cycle is performed, it is possible to promote the introduction of the Si—C bond while properly suppressing the introduction of the Si—N bond into the film formed on the wafer 200.

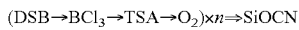

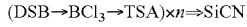

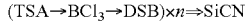

(Modification 7)

As in film-forming sequences shown below, the formation of the silicon oxycarbide film (SiOC film) containing Si, O and C on the wafer 200 and the formation of the silicon oxynitride film (SiON film) containing Si, O and N on the wafer 200 may be alternately repeated ($n_1$ to $n_3$ are integers of 1 or more, respectively). This modification can also obtain the same effects as the film-forming sequence shown in FIG. 4. In addition, by setting the film thickness of each of the SiOC film and the SiON film to be equal to or more than 0.1 nm and equal to or less than 5 nm, a stacked film finally formed may be a nanolaminate film having the characteristics that are unified in the stacking direction and are indivisible as a whole. Further, by adjusting the film thickness ratio between the SiOC film and the SiON film, it is possible to control the composition ratio of the finally formed stacked film in a wide range.

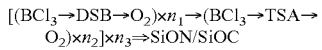

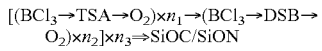

(Modification 8)

As in film-forming sequences shown below, the performance timing of the step of supplying the BCl$_3$ gas may be changed for each cycle. This modification can also obtain the same effects as the film-forming sequence shown in FIG. 4. In addition, it is possible to promote the introduction of the Si—C bond and the introduction of the Si—N bond into the film formed on the wafer 200 with good balance. Further, it is also possible to control the C concentration and N concentration in the film formed on the wafer 200 in the film thickness (depth) direction.

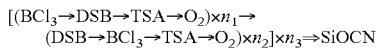

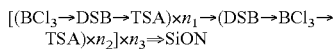

(Modification 9)

As in film-forming sequences shown below, the order of supply of the DSB gas and the TSA gas may be exchanged for each cycle. This modification can also obtain the same effects as the film-forming sequence shown in FIG. 4. In addition, it is possible to promote the introduction of the Si—C bond and the introduction of the Si—N bond into the film formed on the wafer 200 with good balance. Further, it is also possible to control the C concentration and N concentration in the film formed on the wafer 200 in the film thickness (depth) direction.

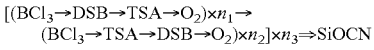

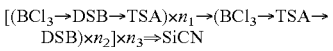

(Modification 10)

In the post-treatment step, the SiOCN film formed on the wafer 200 may be irradiated with N$_2$ plasma, a microwave or the like. This modification can also obtain the same effects as in the case of performing the heat treatment in the post-treatment step. In addition, in the case of performing the plasma irradiation treatment or the microwave irradiation treatment, it is possible to further lower the processing temperature as compared with the case of performing the heat treatment and it is also possible to reduce the thermal history of the wafer 200. For example, in the case of performing the plasma irradiation treatment or the microwave irradiation treatment, the processing temperature can be set to the room temperature (25 degrees C.) or more and 470 degrees C. or less, further to the room temperature or more and 450 degrees C. or less. That is, it is also possible to set the processing temperature of the post-treatment step to be equal to the processing temperature of the film-forming step.

(Modification 11)

In the film-forming sequence shown in FIG. 4, the film-forming step and the post-treatment step are performed in the same process chamber 201, that is, in-situ. However, the film-forming step and the post-treatment step may be performed in different process chambers, that is, ex-situ. Further, the post-treatment step may not be performed after the film-forming step is performed. This modification can also obtain substantially the same effects as the film-forming sequence shown in FIG. 4.

Other Embodiments

While some embodiments of the present disclosure have been specifically described above, the present disclosure is not limited to the aforementioned embodiments but may be differently modified without departing from the subject matter of the present disclosure.

Recipes used in substrate processing may be prepared individually according to the processing contents and may be stored in the memory device 121c via a telecommunication line or the external memory device 123. Moreover, at the start of the substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed using a batch-type substrate processing apparatus capable of processing a plurality of substrates at a time has been described in the above embodiments. The present disclosure is not limited to the above embodiments but may be appropriately applied to, e.g., a case where films are formed using a single-wafer-type substrate processing apparatus capable of processing a single substrate or several substrates at a time. In addition, the example in which films are formed using a substrate processing apparatus provided with a hot-wall-type process furnace has been described in the above embodiments. The present disclosure is not limited to the above embodiments but may be appropriately applied to a case where films are formed using a substrate processing apparatus provided with a cold-wall-type process furnace.

Even in the case of using these substrate processing apparatuses, film formation can be performed under the same processing procedure and processing condition as in the above-described embodiments and modifications and the same effects as those of the above embodiments and modifications can be obtained.

In addition, the embodiments and modifications described above can be used in appropriate combination. The processing procedure and processing condition at this time can be the same as the processing procedure and processing condition of the above-described embodiments and modifications.

EXAMPLES

Example 1

As samples A1 to A3, the substrate processing apparatus shown in FIG. 1 was used to form a SiOCN film on a wafer by performing a cycle a predetermined number of times, the cycle including non-simultaneously supplying a DSB gas, a TSA gas and an $O_2$ gas in this order to the wafer. The process condition for preparing the sample A1 was set to a predetermined condition within the process condition range described in the above embodiment. The process condition for preparing the sample A2 was the same as the process condition for preparing the sample A1 except that the supply time of the TSA gas per cycle was set to be longer than that in the preparation of the sample A1. The process condition for preparing the sample A3 was the same as the process condition for preparing the sample A1 except that the supply time of the DSB gas per cycle was set to be longer than that in the preparation of the sample A1.

Then, the concentrations of N, C, etc. contained in the SiOCN films of the samples A1 to A3 were measured by XRF (fluorescent X-ray analysis). FIG. 7 shows the results of the measurement. In FIG. 7, the vertical axis represents the N and C concentrations (a.u.) in the SiOCN films measured by XRF, and the horizontal axis represents the samples A1 to A3 in order. It can be seen from FIG. 7 that the N concentration of the SiOCN film of the sample A2 is higher than the N concentration of the SiOCN film of the sample A1. On the other hand, it can be seen that the C concentration of the SiOCN film of the sample A2 is lower than the C concentration of the SiOCN film of the sample A1. Further, it can be seen that the C concentration of the SiOCN film of the sample A3 is higher than the C concentration of the SiOCN film of the sample A1. On the other hand, it can be seen that the N concentration of the SiOCN film of the sample A3 is lower than the N concentration of the SiOCN film of the sample A1. From these facts, it is understood that the N concentration and C concentration of the SiOCN film formed on the wafer can be adjusted by controlling the supply time of the TSA gas per cycle, that is, the supply amount of the TSA gas to the wafer. It is also understood that the C concentration and N concentration of the SiOCN film formed on the wafer can be adjusted by controlling the supply time of the DSB gas per cycle, that is, the supply amount of the DSB gas to the wafer.

Example 2

As samples B1 to B3, the substrate processing apparatus shown in FIG. 1 was used to form a SiOCN film on a wafer by performing a cycle a predetermined number of times, the cycle including non-simultaneously supplying a DSB gas, a TSA gas and an $O_2$ gas in this order to the wafer. When preparing the sample B1, the supply time (oxidation time) of the $O_2$ gas per cycle was set to 40 seconds. The other process condition was a predetermined condition within the process condition range described in the above embodiment. When preparing the sample B2, the oxidation time per cycle was 60 seconds. The other process condition were the same as the process condition for preparing the sample B1. When preparing the sample B3, the oxidation time per cycle was 90 seconds. The other process condition was the same as the process condition for preparing the sample B1.

Then, the concentrations and refractive indices of N, C, etc. of the SiOCN films of the samples B1 to B3 were measured. The concentrations of N, C, etc. of the SiOCN films were measured by XRF as in Example 1. FIG. 8 shows the results of the measurement. In FIG. 8, the left vertical axis represents the N and C concentrations (a.u.) in a SiOCN film measured by XRF, the right vertical axis represents the refractive indices, and the horizontal axis represents the supply time (sec) of the $O_2$ gas per cycle. In the figure, a mark ■ indicates the N concentration, a mark ♦ indicates the C concentration, and a mark ▲ indicates the refractive index. It can be seen from FIG. 8 that the refractive index of the SiOCN film is lowered by prolonging the oxidation time per cycle. That is, it is understood that it is possible to increase the $O_2$ concentration of the SiOCN film by increasing the oxidation time per cycle. In addition, it can be seen from FIG. 8 that, even when the oxidation time per cycle is increased, there is no significant change in the N concentration and C concentration in the SiOCN film. It may be considered that this is because the SiOCN film formed by the method shown in FIG. 4 contains C or N in the form of Si—C bond or Si—N bonds, thereby providing high ashing resistance and low probability of desorption of C and N.

Example 3

As a sample C1, the substrate processing apparatus shown in FIG. 1 was used to form a SiOCN film on a wafer by performing a cycle a predetermined number of times, the cycle including non-simultaneously supplying a DSB gas, a TSA gas and an $O_2$ gas in this order to the wafer. The process condition was set to a predetermined condition within the process condition range described in the above embodiment.

As a sample C2, a SiOCN film was formed on a wafer by performing a cycle a predetermined number of times, the cycle non-simultaneously performing a step of supplying a hexachlorodisilane ($Si_2Cl_6$, abbreviation: HCDS) gas to the wafer, a step of supplying a propylene ($C_3H_6$) gas, a step of supplying an $O_2$ gas, and a step of supplying an ammonia ($NH_3$) gas in this order.

As a sample C3, a SiOCN film was formed on a wafer by performing a cycle a predetermined number of times, the cycle non-simultaneously performing a step of supplying a HCDS gas to the wafer, a step of supplying a triethylamine (($C_2H_5)_3$N, abbreviation: TEA) gas, and a step of supplying an $O_2$ gas in this order.

Then, the composition ratios of the SiOCN films of the samples C1 to C3, that is, the concentrations of Si, O, C, N, etc. contained in each SiOCN film were measured by XPS (X-ray photoelectron spectroscopy). The results of the measurement are shown in FIG. 9A. In FIG. 9A, the vertical axis represents the Si, O, C and N concentrations [at %] in the SiOCN film measured by XPS. The horizontal axis represents the samples C2, C3 and C1 in order. It can be seen from FIG. 9A that the SiOCN film of the sample C1 has lower C concentration and N concentration and higher O concentration than the SiOCN films of the samples C2 and C3. This may be estimated that the SiOCN film of the sample C1 will exhibit a lower dielectric constant than the SiOCN films of the samples C2 and C3. Further, it can be seen from FIG. 9A that Cl is not detected from the SiOCN film of the sample C1, whereas the SiOCN films of the samples C2 and C3 each contains a small amount of Cl.

In addition, the proportion of the bond state of C contained in the SiOCN films of the samples C1 and C2 was measured. In FIG. 9B, the vertical axis represents the proportion of the bond state of C contained in the SiOCN films, and the horizontal axis represents the samples C2 and C1 in order. It can be seen from FIG. 9B that the SiOCN film of the sample C1 has a higher proportion of the Si—C bond among the various chemical bonds of C than the SiOCN film of the sample C2. Further, it can be seen that the SiOCN film of the sample C1 has a lower proportion of bonds, which may cause deterioration of processing resistance, such as the C—C bond, the C—O bond, the C—H bond and the like, among the various chemical bonds of C than the SiOCN film of the sample C2. This may be estimated that the SiOCN film of the sample C1 will have higher processing resistance than the SiOCN film of the sample C2.

Example 4

As samples D1 to D3, the substrate processing apparatus shown in FIG. 1 was used to form a SiOCN film on a wafer by performing film-forming sequences shown below. When preparing the samples D1 to D3, the process condition for each step were the same predetermined condition within the process condition range described in the above embodiment.

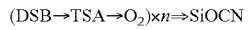

Sample D1:

Sample D2:

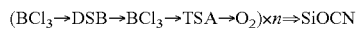

Sample D3:

Then, the step coverage (hereinafter also referred to as S/C) of each of the SiOCN films of samples D 1 to D 3 were measured. S/C means that the greater its value, the better the step coverage. FIG. 10 shows results of the measurement. It can be seen from FIG. 10 that S/Cs of these films are 65%, 102% and 103% in the order of the samples D1 to D3. That is, it is understood that it is possible to improve the S/C of a film formed on the wafer by supplying a catalyst ($BCl_3$ gas) before supplying a precursor (DSB gas or TSA gas) in performing a film-forming step.

According to the present disclosure in some embodiments, it is possible to improve the quality of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   forming a film containing Si, C and N on the substrate by performing a cycle a predetermined number of times, the cycle including non-simultaneously performing:
   (a) supplying a first precursor containing one or more Si—C bonds and not containing halogen to the substrate; and
   (b) supplying a second precursor containing one or more Si—N bonds and not containing an alkyl group to the substrate,
   wherein (a) is performed under a condition that at least a part of the Si—C bonds in the first precursor is held without being cut, and
   wherein (b) is performed under a condition that at least a part of the Si—N bonds in the second precursor is held without being cut.

2. The method of claim 1, wherein the cycle further includes performing (c) supplying an oxidizing agent to the substrate non-simultaneously with (a) and (b).

3. The method of claim 1, wherein the cycle further includes performing (d) supplying a catalyst to the substrate before performing at least one selected from the group of (a) and (b).

4. The method of claim 3, wherein the cycle further includes performing removing the catalyst, which floats in a space where the substrate exists, after performing (d) and before performing at least one selected from the group of (a) and (b).

5. The method of claim 3, wherein, in the cycle, at least one selected from the group of (a) and (b) is performed in a state where the catalyst is adsorbed onto a surface of the substrate and the catalyst does not float in a space where the substrate exists.

6. The method of claim 5, wherein a first intermediate containing a Si—C bond generated by decomposition of the first precursor by an action of the catalyst adsorbed onto the surface of the substrate is adsorbed onto the surface of the substrate, in (a).

7. The method of claim 5, wherein a second intermediate containing a Si—N bond generated by decomposition of the second precursor by an action of the catalyst adsorbed onto the surface of the substrate is adsorbed onto the surface of the substrate, in (b).

8. The method of claim 3, wherein (a), (b) and (d) are performed under a condition that the catalyst is not thermally decomposed.

9. The method of claim 3, wherein the cycle includes sequentially performing (d), (a), and (b), or includes sequentially performing (d), (b), and (a).

10. The method of claim 3, wherein the cycle includes sequentially performing (d), (a), (d), and (b), or includes sequentially performing (d), (b), (d), and (a).

11. The method of claim 1, wherein the first precursor contains no alkyl group and the second precursor contains no halogen.

12. The method of claim 1, wherein each of the first precursor and the second precursor further contains a Si—H bond.

13. The method of claim 1, wherein each of the first precursor and the second precursor does not contain a bond between C and C bonded to two or more of four bonding hands of C, a C—O bond, a C—N bond, a Si—R bond, a N—H bond and a N—O bond, wherein R is an alkyl group.

14. The method of claim 1, wherein each of the first precursor and the second precursor does not contain a bond between C and C bonded to three or more of four bonding hands of C, a C—O bond, a C—N bond, a Si—R bond, a N—H bond and a N—O bond, wherein R is an alkyl group.

15. The method of claim 1, wherein the second precursor includes a structure in which three Si atoms are bonded to one N atom.

16. The method of claim 1, wherein the first precursor includes at least one of 1,3-disilapropane, 1,4-disilabutane, 1,3-disilabutane, 1,3,5-trisilapentane, 1,3,5-trisilacyclohexane and 1,3-disilacyclobutane, and the second precursor includes trisilylamine.

17. The method of claim 1, wherein the forming the film is performed in a non-plasma atmosphere.

18. The method of claim 1, further comprising performing post-treatment to the film formed on the substrate.

19. A method of manufacturing a semiconductor device comprising the method of claim 1.

* * * * *